United States Patent
Kong et al.

(10) Patent No.: US 6,835,368 B2
(45) Date of Patent: Dec. 28, 2004

(54) DOUBLY DOPED LITHIUM NIOBATE CRYSTALS

(75) Inventors: Yongfa Kong, Tianjin (CN); Jingjun Xu, Tianjin (CN); Guangao Li, Tianjin (CN); Qian Sun, Tianjin (CN); Baiquan Tang, Tianjin (CN); Hui Huang, Tianjin (CN); Ziheng Huang, Tianjin (CN); Shaolin Chen, Tianjin (CN); Xiaojun Chen, Tianjin (CN); Guangyin Zhang, Tianjin (CN)

(73) Assignee: Nankai University, Tianjin (CN)

( * ) Notice: Subject to any disclaimer, the term of this patent is extended or adjusted under 35 U.S.C. 154(b) by 295 days.

(21) Appl. No.: 09/881,836

(22) Filed: Jun. 18, 2001

(65) Prior Publication Data

US 2002/0009405 A1 Jan. 24, 2002

(30) Foreign Application Priority Data

Jul. 20, 2000 (CN) ..................... 00121092 A

(51) Int. Cl.$^7$ .............. C01D 1/02; G02B 5/20
(52) U.S. Cl. .................. 423/594.15; 252/584
(58) Field of Search ............. 423/594.15; 252/584

(56) References Cited

PUBLICATIONS

Alexander Hellemans, Frontier In Optics, Science, *Holograms Can Store Terabytes, But Where?*, vol. 286, pp. 1502–1504, Nov. 19, 1999.

Guangyin Zhang et al., Department of Physics, Nankai University, Tianji, China, *Study of Resistance Against Photorefractive Light–Induced Scattering*, SPIE vol. 2529, pp. 14–17. 1995.

Amnon Yariv et al., T.J. Watson Laboratory, California Institute of Technology, Pasadena, California, *Holographic Storage Dynamics in Lithium Niobate: Theory and Experiment*, vol. 13, No. 11, pp. 2513–2523, Nov. 1996.

IBM Holographic Optical Storage Team, Laser Focus World, *Holographic Storage Delivers High Data Density*, pp. 123–127, Dec. 2000.

*Primary Examiner*—Stanley Silverman
*Assistant Examiner*—Jonas N. Strickland
(74) *Attorney, Agent, or Firm*—Armstrong, Kratz, Quintos, Hanson & Brooks, LLP

(57) ABSTRACT

This invention relates to the field of materials of the photorefractive crystal. The composition of these crystals is $Li_{1-x}Nb_{1+y}O_3$: $Fe_m$, $M_n$, where M can be magnesium, indium, or zinc; when using q to denote the ion valence of M (q=2 when M is Mg or Zn, and q=3 when M is In), the values of x, y, m, and n are in the range of $0.05 \leq x \leq 0.13$, $0.00 \leq y \leq 0.01$, $5.0 \times 10^{-5} \leq m \leq 7.5 \times 10^{-4}$, and $0.02 \leq qn \leq 0.13$. This invention greatly improves the photorefractive properties of $LiNbO_3$ crystals: makes it have a high diffraction efficiency (more than 68%), a fast response speed for photorefraction (an order of magnitude faster than iron doped $LiNbO_3$), and a high resistance to optical scattering (the light intensity threshold to photorefractive fan scattering near two orders of magnitude larger than $LiNbO_3$: Fe). This invention is an excellent three-dimensional optical storage material and has a vast potential market.

7 Claims, No Drawings

DOUBLY DOPED LITHIUM NIOBATE CRYSTALS

TECHNICAL FIELD

The invention relates to the field of photorefractive crystal material.

BACKGROUND ART

Three-dimensional optical storage will enter the market, but it does not mean that the product has been done very well. The main problem is no excellent three-dimensional optical storage material found. In fact, scientists in the world have been looking for satisfied three-dimensional optical storage material for a long time. Up to now, the iron doped lithium niobate is still considered as the first candidate. But there are big shortcomings for $LiNbO_3$:Fe, such as a too long response time and a low ability to resist optic scattering (A. Hellemans, Holograms can storage terabytes, but where? Science 286 (1999) 1502). Now, improving and optimizing the properties of $LiNbO_3$:Fe crystal (restrain the laser induced voltage effect and maintain its good photorefraction properties in the mean time) is still the most important task at present.

DISCLOSURE OF THE INVENTION

The objection of this invention is to supply a doubly doped lithium niobate crystal, which is an improvement and optimization of $LiNbO_3$:Fe, and has an excellent photorefractive properties, and can be used as the three-dimensional holographic optical storage material.

The doubly doped lithium niobate crystal of the invention is doped with iron and a second radius-matched metal ion in the meantime. Its composition can be denoted as $Li_{1-x}Nb_{1+y}O_3$:$Fe_m$,$M_n$, where M is magnesium, indium, or zinc; when using q to denote the ion valence of M (q=2 when M is Mg or Zn, and q=3 when M is In), the values of x, y, m, and n are in the range of $0.05 \leq x \leq 0.13$, $0.00 \leq y \leq 0.01$, $5.0 \times 10^{-5} \leq m \leq 7.5 \times 10^{-4}$, and $0.02 \leq qn \leq 0.13$, respectively.

The composition of doubly doped lithium niobate crystals can:

doped with 0.007~0.03 wt. % Fe and 1.0~5.0 mol. % Mg, doped with 0.01~0.05 wt. % Fe and 0.75~3.0 mol. % In, or doped with 0.02~0.06 wt. % Fe and 1.5~6.5 mol. % Zn, While the congruent composition is [Li]/[Nb]=0.87~0.95.

The implement steps of the invention are:

(1) Weigh up $Li_2CO_3$, $Nb_2O_3$, $Fe_2O_3$, and MgO, $In_2O_3$ or ZnO powders according to the crystal composition, and dry them at 120~150° C. for 25 hours, then thoroughly mix them at a mixer lasting for 24 hours, and keep them at 800~850° C. for 2~5 hours to make $Li_2CO_3$ decompose sufficiently, and then sinter at 1050~1150° C. for 2~8 hours to obtain doubly doped lithium niobate powder. (2) Put the above doped lithium niobate powder into a Pt crucible after impacted then heat the powder by a middle frequency stove. Grow the doubly doped lithium niobate crystals using the Czochralski pulling method along c or a axis via the procedures of necking, shouldering, uniform-diametering, and tailing, with the pulling rate being 1~3 mm/h, the rotation rate being 15~30 rpm, the temperature difference of the melt-crystal interface being 20° C., the temperature gradient in the melt volume near the surface being 1.5° C./mm, and the temperature gradient above the melt surface being 1.0° C./mm, respectively.

(3) Pole and anneal the grown doped lithium niobate crystals at 1200° C. to obtain a single-domain structure.

OPTIMUM REALIZATION OF THE INVENTION

The outstandingly essential characteristics and effects of the invention can be seen from the following embodiments, but they do no limit to the scope of this invention.

Embodiment 1:

(1) Weigh up 0.01 wt. % $Fe_2O_3$ and 3 mol. % MgO, and $[Li_2CO_3]/[Nb_2O_5]=0.94$. and dry them at 150° C. for 2 hours, then thoroughly mix them at a mixer lasting for 24 hours, and keep them at 850° C. for 2 hours to make $Li_2CO_3$ decompose sufficiently, and then sinter at 1100° C. for 2 hours to obtain doubly doped lithium niobate powder. (2) Put the above doped lithium niobate powder into a Pt crucible after impacted then heat the powder by a middle frequency stove. Grow the doubly doped lithium niobate crystals using the Czochralski pulling method along c axis via the procedures of necking, shouldering, uniform-diametering, and tailing, with the pulling rate being 3 mm/h, the rotation rate being 27 rpm, the temperature difference of the melt-crystal interface being 20° C., the temperature gradient in the melt volume near the surface being 1.5° C./mm, and the temperature gradient above the melt surface being 1.0° C./mm, respectively. (3) Pole and anneal the grown doped lithium niobate crystals at 1200° C. to get a single-domain structure. After being orientated, cut, grinded, and polished to optical grade, the maximum diffraction efficiency of this Fe and Mg doubly lithium niobate crystal is 70%, the light intensity threshold to optic scattering is larger than 20 mW, and the average write time for holographic storage is 5 s (I~1 $W/cm^2$).

Embodiment 2:

(1) Weigh up 0.015 wt. % $Fe_2O_3$ and 0.5 mol. % $In_2O_3$, and $[Li_2CO_3]/[Nb_2O_5]=0.945$. and dry them at 150° C. for 2 hours, then thoroughly mix them at a mixer lasting for 24 hours, and keep them at 850° C. for 2 hours to make $Li_2CO_3$ decompose sufficiently, and then sinter at 1100° C. for 2 hours to obtain doubly doped lithium niobate powder. (2) Put the above doped lithium niobate powder into a Pt crucible after impacted, then heat the powder by a middle frequency stove. Grow the doubly doped lithium niobate crystals using the Czochralski pulling method along c axis via the procedures of necking, shouldering, uniform-diametering, and tailing, with the pulling rate being 2 mm/h, the rotation rate being 25 rpm, the temperature difference of the melt-crystal interface being 20° C., the temperature gradient in the melt volume near the surface being 1.5° C./mm, and the temperature gradient above the melt surface being 1.0° C./mm, respectively. (3) Pole and anneal the grown doped lithium niobate crystals at 1200° C. to get a single-domain structure. After being orientated, cut, grinded, and polished to optical grade, the maximum diffraction efficiency of this Fe and In doubly lithium niobate crystal is 72%, the light intensity threshold to optic scattering is larger than 30 mW, and the average write time for holographic storage is 3 s (I~1 $W/cm^2$).

Embodiment 3:

(1) Weigh up 0.025 wt. % $Fe_2O_3$ and 6 mol. % ZnO, and $[Li_2CO_3]/[Nb_2O_5]=0.88$. and dry them at 150° C. for 2 hours, then thoroughly mix them at a mixer lasting for 24 hours, and keep them at 850° C. for 2 hours to make $Li_2CO_3$ decompose sufficiently, and then sinter at 1100° C. for 2 hours to obtain doubly doped lithium niobate powder. (2) Put the above doped lithium niobate powder into a Pt crucible after impacted, then heat the powder by a middle frequency stove. Grow the doubly doped lithium niobate crystals using the Czochralski pulling method along c axis via the procedures of necking, shouldering, uniform-diametering, and tailing, with the pulling rate being 1.5 mm/h, the rotation rate being 20 rpm, the temperature difference of the melt-crystal interface being 20° C., the temperature gradient in the melt volume near the surface being 1.5° C./mm, and the temperature gradient above the melt surface being 1.0° C./mm, respectively. (3) Pole and anneal the grown doped lithium niobate crystals at 1200° C. to get a single-domain structure. After being orientated, cut, grinded, and polished to optical grade, the maximum diffraction efficiency of this Fe and Zn doubly lithium niobate crystal is 68%, the light intensity threshold to optic scattering is larger than 50 mW, and the average write time for holographic storage is 3 s (I~1 W/cm$^2$).

INDUSTRIAL APPLICABILITY

The invented doubly doped lithium niobate crystals have high diffraction efficiency for three-dimensional holographic photorefractive grating, which is more than 68%. The photorefractive response time is 3~5 s, an order of magnitude faster than LiNbO3:Fe. They have a high resistance to optical scattering, that is the light intensity threshold for photorefractive fanning optical scattering is as almost two orders of magnitude higher than LiNbO$_3$: Fe crystal. Comparing with the same products in the world, the response times of these doubly doped lithium niobate crystals have been improved by 1–2 orders of magnitude so as to be an excellent three-dimensional holographic optical storage material. These doubly doped lithium niobate crystals have widely potential applications in three-dimensional holographic optical disk, integration optics, military antagonizing, civil navigation, finance, stocks, etc.

What is claimed is:

1. A doubly doped lithium niobate crystal, comprising:

$$Li_{1-x}Nb_{1+y}O_3:Fe_m, M_{qn}$$

where, M is a member selected from the group consisting of Mg, Zn, and In, provided when M is Mg or Zn, q=2, and when M is In, q=3;
x is in the range of $0.05 \leq x \leq 0.13$;
y is in the range of $0.00 \leq y \leq 0.01$;
m is in the range of $5.0 \times 10^{-5} \leq m \leq 7.5 \times 10^{-4}$; and
qn is in the range of $0.02 \leq qn \leq 0.13$,
wherein said doubly doped lithium niobate crystal has an average photorefractive response time from 3 to 5 seconds and a diffraction efficiency more than 68%.

2. The doubly doped lithium niobate crystal as claimed in claim 1, said $$Li_{1-x}Nb_{1+y}O_3:Fe_m, M_{qn}$$

is doped with 0.007 to 0.03 wt % Fe, and M is 1.0 to 5.0 mol % Mg, where the congruent composition is [Li]/[Nb]=0.90:0.95.

3. The doubly doped lithium niobate crystal as claimed in claim 1, said $$Li_{1-x}Nb_{1+y}O_3:Fe_m, M_{qn}$$

is doped with 0.01 to 0.05 wt % Fe, and M is 0.75 to 3.0 mol % In, where the congruent composition is [Li]/[Nb]=0.91:0.95.

4. The doubly doped lithium niobate crystal as claimed in claim 1, said $$Li_{1-x}Nb_{1+y}O_3:Fe_m, M_{qn}$$

is doped with 0.02 to 0.06 wt % Fe, and M is 1.5 to 6.5 mol % Zn, where the congruent composition is [Li]/[Nb]=0.87:0.95.

5. A three-dimensional optical storage material, comprising the doubly doped lithium niobate crystals as claimed in any one of claim 1–4, 6 or 7.

6. A doubly doped lithium niobate crystal, comprising:

$$Li_{1-x}Nb_{1+y}O_3:Fe_m,In_{qn}$$

where q=3;
x is in the range of $0.05 \leq x \leq 0.13$;
y is in the range of $0.00 \leq y \leq 0.01$;
m is in the range of $5.0 \times 10^{-5} \leq m \leq 7.5 \times 10^{-4}$; and
qn is in the range of $0.02 \leq qn\ 0.13$, and
said doubly doped lithium niobate crystal is doped with 0.01 to 0.05 wt % Fe, and In is 0.75 to 3.0 mol % In, where the congruent composition is [Li]/[Nb]=0.91:0.95.

7. A doubly doped lithium niobate crystal, comprising:

$$Li_{1-x}Nb_{1+y}O_3:Fe_m, Zn_{qn}$$

where q=2;
x is in the range of $0.05 \leq x \leq 0.13$;
y is in the range of $0.00 \leq y \leq 0.01$;
m is in the range of $5.0 \times 10^{-5} \leq m \leq 7.5 \times 10^{-4}$; and
qn is in the range of $0.02 \leq qn\ 0.13$, and
said doubly doped lithium niobate crystal is doped with 0.02 to 0.06 wt % Fe, and Zn is 1.5 to 6.5 mol % Zn, where the congruent composition is [Li]/[Nb]=0.87:0.95.

* * * * *